US012772380B2

(12) United States Patent
Von Rhein

(10) Patent No.: US 12,772,380 B2
(45) Date of Patent: Oct. 20, 2026

(54) CIRCUIT SYSTEM AND METHOD FOR RADAR, LIDAR, OR CAMERA SYSTEMS

(71) Applicant: HELLA GmbH & Co. KGaA, Lippstadt (DE)

(72) Inventor: Andreas Von Rhein, Salzkotten (DE)

(73) Assignee: HELLA GmbH & Co. KGaA, Lippstadt (DE)

( * ) Notice: Subject to any disclaimer, the term of this patent is extended or adjusted under 35 U.S.C. 154(b) by 233 days.

(21) Appl. No.: 18/800,867

(22) Filed: Aug. 12, 2024

(65) Prior Publication Data

US 2025/0056724 A1 Feb. 13, 2025

(30) Foreign Application Priority Data

Aug. 10, 2023 (DE) ..................... 10 2023 121 454.3

(51) Int. Cl.
*H05K 1/14* (2006.01)
*H05K 1/181* (2026.01)

(52) U.S. Cl.
CPC ............. *H05K 1/141* (2013.01); *H05K 1/181* (2013.01); *H05K 2201/10159* (2013.01)

(58) Field of Classification Search
CPC .................. H05K 1/141; H05K 1/181; H05K 2201/10159
See application file for complete search history.

(56) References Cited

U.S. PATENT DOCUMENTS

| | | | | |
|---|---|---|---|---|
| 5,036,473 A * | 7/1991 | Butts | G06F 15/7867 703/23 |
| 11,681,013 B2 | 6/2023 | Melzer et al. | |
| 2018/0217344 A1* | 8/2018 | Fini | G02B 6/4249 |
| 2024/0310476 A1 | 9/2024 | Welle et al. | |

FOREIGN PATENT DOCUMENTS

| | | |
|---|---|---|
| DE | 102016224747 A1 | 6/2018 |
| DE | 102019115107 B3 | 9/2020 |
| WO | WO2022184238 A1 | 9/2022 |

* cited by examiner

*Primary Examiner* — Sherman Ng
(74) *Attorney, Agent, or Firm* — Muncy, Geissler, Olds & Lowe, P.C.

(57) ABSTRACT

A circuit system, a method, a computer program product, as well as a non-volatile, computer-readable storage medium, which may be used, for example, for radar, lidar, or camera systems. The circuit system comprises single logic chips, the at least two single logic chips being connected to each other by a switch to facilitate a data processing by the at least two individual logic chips by a combination of the particular memories and computing units.

15 Claims, 4 Drawing Sheets

CIRCUIT SYSTEM AND METHOD FOR RADAR, LIDAR, OR CAMERA SYSTEMS

This nonprovisional application claims priority under 35 U.S.C. § 119 (a) to German Patent Application No. 10 2023 121 454.3, which was filed in Germany on Aug. 10, 2023, and which is herein incorporated by reference.

BACKGROUND OF THE INVENTION

Field of the Invention

The invention relates to a circuit system, a method, a computer program product, and a non-volatile, computer-readable storage medium.

Description of the Background Art

Known radar systems and the structural component used for them are becoming more and more powerful. This may be attributed, among other things, to the fact that radar systems often have a multiplicity of transmitting, receiving, and/or transceiving devices, data being generated, in particular, during reception. The use of so-called corner radar systems is also known, which have good results during imaging with the aid of a comparatively small number of transmitting and/or receiving devices, in particular antenna, as well as limited storage and/or computing capacity. At the same time, however, the cost pressure for manufacturing, assembly, and/or maintenance is increasing. In particular, the weight and/or installation space should not be disproportionately great.

To meet the steadily growing requirements of greater performance (in particular, range and/or angle measuring capability), the number of antennas may (or must) be significantly increased. This may relate to the antenna as well as to the downstream data processing in the HF chain. The use of existing HF (high-frequency) chips makes this possible, for example MMIC (monolithic microwave integrated circuit), and/or μC/DSP (microcontroller/digital signal controller), or FPGA (field programmable gate array). Cost-optimized single ICs (or single logic chips) are also available on the market and in development, in which the μC/DSP has been integrated with the HP portion in one chip However, the storage and/or computing capacity of a single IC or single logic chip of this type is/are often insufficient to store and/or calculate all necessary data, in particular for real-time calculations, for the requirements described above, in particular in the high-performance area, for example in automobiles.

Up to now, for example, a computer or a computing unit had to be provided, in particular, separately or externally to manage the high storage and/or computing requirements and preferably to facilitate a calculation and/or calculation essentially in real time (in the first place).

SUMMARY OF THE INVENTION

It is therefore an object of the present invention to at least partially overcome at least one of the disadvantages described above. In particular, the object of the invention is to use any single logic chips that may be present in such a way that an easier, improved, more cost-effective, more modular, scalable, and/or more exchangeable manufacturing, assembly, and/or maintenance may be achieved.

The above object is achieved by a circuit system, by a method, by a computer program product, as well as by a non-volatile, computer-readable storage medium. Features and details which are described in connection with the circuit system according to the invention also apply, of course, in connection with the method according to the invention, and/or in connection with the computer program product according to the invention, and/or in connection with the non-volatile, computer-readable storage medium according to the invention, and vice versa in each case, so that reference always is or may be made interchangeably with respect to the disclosure of the individual aspects of the invention. In particular, advantages which are described within the scope of the first, second, third, fourth, and/or fifth aspect also apply in each case to the first, second, third, fourth and/or fifth aspect.

According to a first aspect of the invention, the above object is achieved by a circuit system for a radar, lidar, or camera system, which comprises at least two single logic chips, each comprising a memory and/or a computing unit, the at least two single logic chips being connected to each other by a switching device to facilitate a data processing by the at least two individual logic chips (only) by a combination of the particular memory and computing units.

The at least two single logic chips are preferably connected to each other in such a way that they virtually become one large chip, the sum of the memory and computing performance advantageously (again) being sufficient to implement advanced computing and/or memory-intensive systems, for example having a multiplicity of channels for transmission and/or reception. In particular, possibilities may be implemented, such as those based on single IC chips (or single logic chips), for building a cost-optimized and/or scalable toolkit, which advantageously facilitates an easier, improved, more cost-effective, and/or more exchangeable manufacturing, assembly, and/or maintenance. The at least two single logic chips may include structurally identical single logic chips. which may advantageously simplify the construction and/or maintenance as well as involve cost advantages. A multiplicity of single logic chips may furthermore be provided, for example not only 2 but also 3, 4, 5, 6, 8, 10 16, 24, 48, 96, 128, 256, 512 single logic chips to advantageously provide a scalable approach, in particular, for multichannel system. A larger number may facilitate more complex and/or more advanced circuits having a larger number of transmitting, receiving, and/or transceiving channels.

At least one, preferably both, of the at least two single logic chips includes a memory and/or a computing unit, which may be used, in particular, to carry out a data processing. The single logic chip(s) may essentially be designed as a transmit and/or receive unit for radar waves, in particular including a (comparatively small) computing unit for signal evaluation purposes. A single logic chip may include at least one MMIC (monolithic microwave integrated circuit). A particularly efficient distribution of memories and/or computation operations may be achieved thereby. In a radar system, for example, this may comprise steps for receiving, converting (e.g., within the scope of an analog/digital and/or digital/analog conversion), and/or calculating, for example, a row-by-row and/or column-by-column Fourier transform, which, in particular, may essentially take place in sections and may thus be particularly suitable for distributing the calculation to multiple memories and/or computing units. It may be provided that all or only a portion of data is/are supplied to a single logic chip, in particular a forwarding of data being able to take place, in particular of data not needed for a subcalculation.

A memory may include or be a non-volatile, transitory storage medium. A memory may be an internal memory of a single logic chip, which is configured, in particular, to store data or data parts, e.g., first and/or second data parts. The memories of different logic chips may preferably be provided with an identical design to advantageously facilitate an easy exchange.

A computing unit may include a CPU, an FPGA, a microcontroller, and/or an ASIC. A computing unit may be an internal computing unit of a single logic chip, which is configured, in particular, for processing data, calculating computation operations, a multiplicity of computation operations and/or parts of computation operations, in particular for individual calculation, preferably separately from other single logic chips. A computing unit may calculate an individual result within the scope of an individual calculation in each case, based on (first or second, etc.) parts of computation operations, for the purpose of advantageously achieving an optimal distribution of computation operations, in particular to be able to distribute computationally intensive operations, which would not be possible with the aid of one computing unit alone, to at least two computing units. Costs, weight, and/or installation space for larger, in particular external, computing units may be spared thereby.

A switching device designed, in particular, as a switch, may include within the scope of the invention a hardware-based interconnection between the at least two single logic chips. A distribution of data and/or tasks may also be achieved on the software side, for example by means of dedicated control of the single logic chips. A combined virtual chip may be formed thereby. In addition, a switchable and/or scalable toolkit system may be formed, it being possible to remove, add, and/or change components, which has a cost-effective, environmentally friendly, and/or performance-improving effect.

The switching device may connect the memories and/or computing units of the at least two single logic chips to preferably implement a data link which facilitates a data exchange.

The circuit system, the at least two single logic chips, and/or the switching device may be configured, in particular, for the radar device, for example for the 24 GHZ ISM band within the frequency range of 24.0 GHz to 24.25 GHz. However, an application in other frequency ranges (e.g., around 77 GHZ) and/or methods such as for cameras and/or lidar are also conceivable.

The switching device can include a housing and is arranged on a printed circuit board within the housing, in particular the at least two single logic chips being interconnected by the switching device or the printed circuit board to facilitate the data processing only by combining the particular memories and/or computing units or only at all, in particular each of the at least two single logic chips being designed in such a way that their memories and/or computing unit alone do/does not facilitate a data processing. It may be provided that any data processing (at all) and/or the data processing in real time is made possible, in particular, only in that the at least two single logic chips are interconnected. The printed circuit board may facilitate, for example, the electrical connection of the single logic chips. In particular, it is conceivable that the printed circuit board has terminals to which the single logic chips may be flexibly connected and/or switched, for example to control them and/or to facilitate a data exchange. This may facilitate an advantageous assembly and/or maintenance.

Each of the at least two single logic chips can have a data transmission, in particular via the switching device, the data transmission comprising an exchange of data with a memory and/or a computing unit of at least one other single logic chip (preferably all other single logic chips), in particular, the data exchange comprising the exchange of at least one memory address, a read command, and/or a write command. The data transmission may preferably comprise a data exchange between the memory and/or the computing unit of a first single logic chip, with at least one memory and/or one computing unit of at least one other, in particular all other, single logic chips. This may preferably take place via the switching device to advantageously facilitate an at least partially central control. For example, improved methods may thus be implemented centrally, while the single logic chips may preferably remain unchanged. It may be provided that a switching device is used for a number of three or more single logic chips to advantageously improve the data transmission.

The switching device can include a PCIe interface and/or an InfiniBand bus device, to which the at least two single logic chips are connected for the purpose of data transmission. One or each single logic chip may thereby access the memory and/or the computing unit of at least one other single logic chip, in particular in a data communicating manner. A PCIe (peripheral component interconnect express) connection may be particularly preferred, in particular, to facilitate a particularly fast, robust, or cost-effective connection.

The switching device can include a daisy chain connection, the at least two single logic chips being connected to each other directly, in particular a switch-free data exchange being made possible. An especially simple interconnection may be achieved, no switch, in particular, being needed for the connection (switch-free), which advantageously saves costs, weight, and/or material. It is furthermore conceivable to provide a combination of a daisy chain connection, PCIe interface, and/or InfiniBand bus device, it being advantageously possible to optimize the data exchange and/or to make a redundancy possible. A daisy chain connection may preferably optimize, in particular reduce, a data rate for one and/or for each single logic chip, for example because it is shared. In the case of a daisy chain connection, it is conceivable that only adjacent single logic chips essentially have a (direct) connection. The complexity and/or error susceptibility may thus be kept low. it is also alternatively or additionally conceivable that a connection to each other single logic chip exists, whereby the data exchange may be optimized to advantageously prevent redundancies and facilitate a faster calculation.

The data transmission can have an Ethernet connection, in particular each of the at least two single logic chips being connectable to a switch for the purpose of data transmission, in particular the switching device including the switch, and/or the switch being arrange on a switch circuit board separate from the printed circuit board of the switching device, the switch circuit board preferably being able to be arranged outside the housing of the switching device. A particularly modular, exchangeable, improved configuration and/or an easier assembly and/or maintenance may be achieved by an external provision. In addition, a reduced error susceptibility or mutual influencing may be facilitated thereby. The arrangement on the same printed circuit board may mean a lower weight and/or smaller space requirement. Moreover, the data transmission may thus be optimized in terms of high frequency, in particular for the specific application. An Ethernet connection may have a particularly good compatibility with other components and/or be particularly user-friendly. It is also conceivable that the design of the switching device is flexible, in particular, that, for example, an Ethernet connection, a PCIe interface, and/or an InfiniBand bus device may be used, depending on availability. A particularly high flexibility and/or robustness within the scope of a maintenance by be achieved thereby. As a result, products may also be effectively connected to existing systems, e.g., bus systems in the automotive industry. This may advantageously result in cost savings. Alternatively, it is conceivable that the switching device is mounted on the printed circuit board in the housing, in particular, together with the at least two single logic chips. A more compact and/or more cost-effective manufacturing may be achieved thereby.

A protocol comprising remote direct memory access (RDMA) may be used for the data exchange via the data transmission, in particular to relieve the load on the memory and/or the computing unit of at least one of the at least two single logic chips. A relief of the load on the memory and/or the computing unit of all single logic chips may preferably be achieved. A network interface controller (NIC) in the single logic chip may preferably, in particular independently, read and/or write data, preferably without the computing unit having to intervene for this purpose. It is furthermore conceivable to also build this mechanism into the NICs of the single logic chips. Alternatively or additionally, an RDMA mechanism may be recreated by the computing unit, in particular for each single logic chip. Within the scope of a Ethernet connection, in particular, the use of this protocol may ensure a particularly high compatibility, performance, and/or user-friendliness. For example, it may be provided that the switching device includes a multi-GMAC connection, which uses, in particular, an Ethernet connection and/or an RDMA protocol, a reading and/or writing, in particular in parallel, as well as a common calculation, being advantageously facilitated.

The at least two single logic chips can have an LO reference clock sharing and/or a digital synchronization, which may take place between the at least two single logic chips, in particular, via the switching device, using the data transmission and/or using a separate synchronization circuit. It may be provided that an additional (or redundant) synchronization may take place either via the switching device or via a separate switching device. Errors or deviations in the synchronization may thus be detected better and/or more reliably. A more robust and/or redundant synchronization may also be achieved thereby. On the whole, the error susceptibility of the system may be reduced in this way. it may be provided that a synchronization of the single logic chips may at least partially take place by a coordinated transmission and/or reception. This may mean or support a particularly robust synchronization.

The data processing may include at least the calculation based on data recorded or captured by a radar, lidar, or camera system, the calculation including a multiplicity of computation operations, which may not be carried out, in particular, by one single logic chip alone and/or not in real time, the multiplicity of computation operations being able to be divided into preferably essentially uniform parts of computation operations, the parts of computation operation being able to be distributed, preferably uniformly, between the at least two single logic chips for the purpose of individual calculation, whereby the calculation may be carried out and/or carried out in real time. The calculation or the multiplicity of computation operations may be carried out, in particular, (only) by distributing the computation operations to the at least two single logic chips, and/or may be carried out in real time, while, in particular, a calculation would otherwise not be possible, not essentially in real time, and/or only via an undesired external, in particular more heavy, more voluminous, and/or more expensive computing unit. Costs, installation space, complexity, weight, and/or manufacturing, assembly, or maintenance effort may be advantageously spared by the distribution. It is also conceivable that an external and/or separate memory and/or computing unit, for example comprised by the switching device, must be designed to have little memory and/or computing capacity. Costs, installation space, complexity, weight, and/or manufacturing, assembly, or maintenance effort may be advantageously spared by the distribution. The system may furthermore be tailored more flexibly for an application thereby. A uniform distribution may mean that the number of computation operations is essentially cut in half if two single logic chips are present. This may also mean that, in the case of n single logic chips, the particular single logic chip essentially, in particular precisely, carries out a 1/n share of the computation operations.

The calculation can comprise a Fourier transform, in particular a fast Fourier transform (FFT), the individual calculation including the calculation of subareas of the Fourier transform. It may be provided that the fast Fourier transform is carried out in multiple dimensions. For example, one single logic chip may calculate a one-dimensional FFT, and the further dimensions of the FFT may be carried out with the aid of the further single logic chips. A particularly efficient parallelization and/or acceleration may be achieved thereby. For example, within the scope of a radar system (e.g., in the case of FMCW radar systems), a fast chirp sequence may be emitted. The repetition rate for transmission, in particular the chirp repetition rate, may be, for example, between 15 μs and 40 μs. Data may include ADC data, in particular it may include receive data digitized by an analog/digital converter (ADC). This data may be analyzed, for example, for one, preferably for each, chirp, in particular within the time range, and preferably corrected (for example, during a post-processing step). A Fourier transform, in particular an FFT, may be carried out, in particular, within the 15 μs to 40 μs, for example in 1D. Each "bin" (also range bins or Rbins) of the FFT may correspond to a range grid (or range bin), in particular base on the selected chirp bandwidth. It may be provided that individual columns and/or rows from an (in particular, discrete) two-dimensional matrix (of this type) may be processed, in particular, individually. It may be provided to intervene precisely at this point, in particular in that a common or separate calculation (e.g., individual calculation) is effectuated. For example, in a circuit system including four single logic chips (e.g., Chip0, 1, 2, 3) approximately three-quarters of the FFT data, in particular the range FFT data, of each single logic chip may be transmitted to the other chips, for example via an Ethernet connection. It may be provided to proceed, for example, according to the following pattern:

Chip0:
- Contains Rbins 0 to 63 and stores them in its memory;
- transmits 64 to 127 to Chip1, 128 to 191 to Chip2, and 192 to 255 to Chip3

Chip1:
- Contains Rbins 64 through 127 and stores them in its memory;
- transmits 0 to 63 to Chip0, 128 to 191 to Chip2, and 192 to 255 to Chip3

Chip2:
- Contains Rbins 128 to 191 and stores them in its memory;
- transmits 0 to 63 to Chip0, 64 to 127 to Chip1, and 192 to 255 to Chip3

Chip3:

Contains Rbins 192 to 255 and stores them in its memory; transmits 0 to 63 to Chip0, 64 to 127 to Chip1, and 128 to 191 to Chip2

It may be provided that one of the chips or single logic chips alone may not utilize all data, in particular not at the necessary speed, for example in real time. A transmission may take place, in particular as described above, for example via the switching device or data transmission. At the end of a sequence, in particular at the end of a chirp sequence (which may last, for example, for 15 ms to 20 ms), (essentially) a quarter of the complete data (in particular of this sequence) may be present in each single logic chip, preferably in its memory. It may be provided that one of the at least two single logic chips, preferably all single logic chips, takes over the further processing and/or post-processing steps, in particular independently, for example within the scope of an individual calculation. This may comprise, in particular, a Fourier transform, in particular an FFT or v-FFT, via range bins stored, in particular, in its memory. This may alternatively or additionally also comprise a coherent integration of the collected (Tx/Rx) data or ADC data. This may alternatively or additionally also comprise a peak detection. A certain overlap in the peripheral regions may also be provided, for example, to optimized post-processing steps, e.g., a pattern recognition, which would not function as well or not at all in the peripheral region. In the above example, data may still be exchanged in the peripheries (e.g., the peripheral regions) between the Rbins (63/64, 127/128 and 191/192), for example to ensure an edge-free detection. For example, a comparison may take place if a (local) maximum at a peripheral point is or is to be verified during a calculation.

Each of the at least two single logic chips can also be configured to carry out at least one post-processing step after the individual calculation, based on an individual result of the individual calculation of this single logic chip, to obtain a post-processing result. The post-processing may include, in particular, the steps described in the above example. This may therefore comprise a coherent integration of the collected (Tx/Rx) data or ADC data. This may alternatively or additionally also comprise a peak detection, which may advantageously result in a more precise detection, e.g., by means of an equalization. It is furthermore conceivable to use at least one signal filter, for example to smooth, suppress noise, and/or optimize the signal-to-noise ratio, for the purpose advantageously improving the overall result.

According to a second aspect of the invention, the above object is achieved by a method according to the invention for processing data, using a circuit system according to the first aspect of the invention, which comprises at least the following steps for each of the at least two single logic chips: receiving data for processing data with the aid of the single logic chip; storing a first data part in the memory of the single logic chip; transmitting at least one second data part to the memory of at least one other single logic chip, the first data part and the at least second data part preferably overlapping redundantly only in the peripheral regions; and/or carrying out an individual calculation of a first part of computation operations, based on the first data part, with the aid of the computing unit of the single logic chip for the purpose of obtaining an individual result.

A reception may comprise the reception of data which was transmitted by another single logic chip (e.g., as in the above example), in particular a multiplicity of computation operations or the data used therefor, may be distributed thereby essentially uniformly to the memories and/or computing units of all single logic chips. It may also be provided that the single logic chip essentially processes the data or only the data which a transmitting, receiving, and/or transceiving element connected to the single logic chip forwards thereto, this element, in particular, forwarding the data only to one single logic chip (advantageously for optimized and/or easy connection) or to all single logic chips (advantageously to achieve an optimal distribution of the data, e.g., to improve the computing speed). The number of the at least two single logic chips may determine the size of the data parts, in particular as a reciprocal value (in particular, as in the above example). It is conceivable, for example, that, in the case of two single logic chips, a first single logic chip stores essentially half the data, e.g., as the first data part, in its memory, and preferably transmits the other half of the data, e.g., as the second data part, to the second single logic chip, which, in particular, stores this data in its memory. As described above, an overlap, e.g., of 5% of the data, may take place in peripheral regions of the data, in particular, the first data part as well as the second data part sharing 5% of the data, which is thus comprised identically in both data sets. In the case of multiple single logic chips, the second data part may include multiple data parts or constituents (in particular, as in the above example), which are transmitted, in particular, to different single logic chips, preferably to achieve a uniform distribution. It may also be provided that all data not stored by a single logic chip is transmitted in each case to all other single logic chips, and the particular single logic chip preferably stores only relevant data in its memory. The quantity of data in the memory of the particular single logic chip may be advantageously minimized thereby. After the storage and transmission, a calculation may preferably take place, based on the data in the memory of the particular single logic chip. It may be provided that a first single logic chip carries out an individual calculation, based (only) on (its) first data part. It may be correspondingly provided that a second, third, etc. single logic chip carries out an individual calculation, based (only) on a first, second third, etc. data part. The (necessary) memories and/or computing capacity may be distributed thereby to advantageously achieve a faster calculation and/or to facilitate a calculation at all, in particular, essentially in real time.

Within the scope of the method, it may be provided that at least the following step can be carried out before receiving data for the data processing by the single logic chip: Transmitting data to the single logic chip with the aid of the switching device, at least one of the following steps being carried out by the computing unit of the single logic unit, based on the first data part, in particular, after the individual calculation of a first part of computation operations: Carrying out a post-processing step with the aid of the single logic chip, based on the individual result, to obtain a post-processing result; combining the individual results or post-processing results with the aid of the switching device and/or the computing unit to obtain an overall result. Within the scope of radar imaging, an overall result may be, for example, a range profile, a range slow-time data matrix, and/or a range Doppler map. The overall result may subsequently be made available to further systems, for example, of a motor vehicle, to advantageously facilitate decisions for autonomous driving. It may be provided to carry out a compensation of range migration as a post-processing step, which is carried out, in particular, by one computing unit in one single logic chip, by all computing units of the single logic chips together (in particular, in a distributed manner), and/or by a computing unit in the switching device.

Each single logic chip can include a (separate) computing unit and/or a (separate) memory. It is additionally (or alternatively) conceivable that a further computing unit and/or a further memory is/are provided, for example, in the switching device. This may be advantageous to store certain data and/or instructions in the switching device and/or to have them executed thereby, these memories and/or computation operations then not having to be provided elsewhere, in particular in the single logic chips, which advantageously facilitates a more cost-effective manufacturing and/or greater flexibility. The switching device may also act as a master in the resulting circuit system, which facilitates a particularly efficient distribution of memories and/or calculations, whereby redundancies may preferably be avoided and/or minimized. It may thus be ensured that data is not unnecessarily sent back and forth before necessary computation operations are carried out.

According to a third aspect of the invention, the above object is achieved by a computer program product according to the invention, comprised by instructions which may be executed by a computing unit, in particular, of a single logic chip, and which, during the execution of the computer program product by a computing unit, prompt the computing unit to implement the method according to the invention, in particular, according to the second aspect of the invention.

According to a fourth aspect of the invention, the above object is achieved by a non-volatile, computer-readable storage medium according to the invention, which comprises a computer program product according to the third aspect of the invention.

It is furthermore conceivable that, according to a fifth aspect, the above object is achieved by a vehicle, which comprises a circuit system according to the invention according to the first aspect and/or a non-volatile, computer-readable storage medium according to the fourth aspect.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
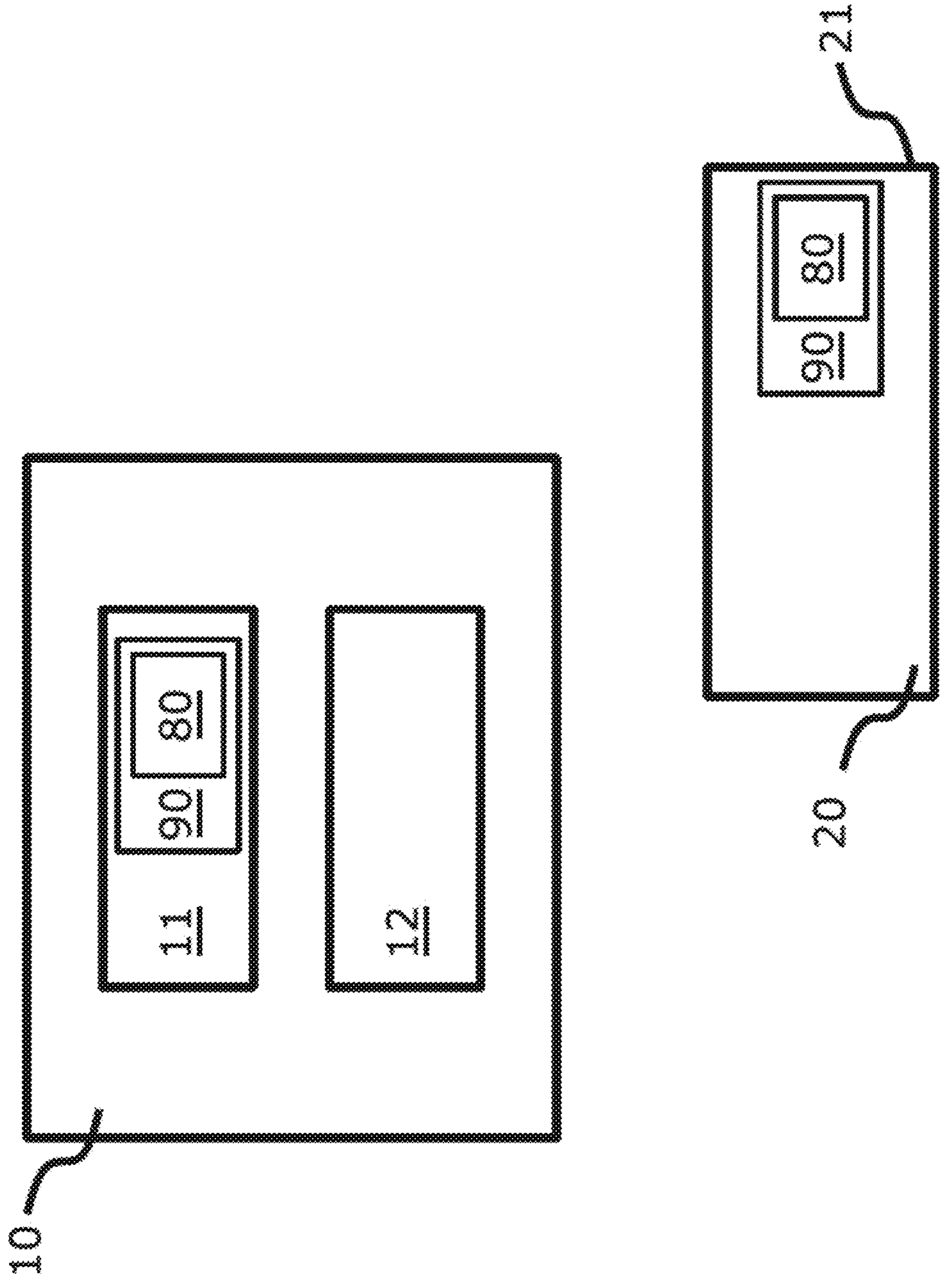
FIG. 1 schematically shows a single logic chip and a switching device of a circuit system according to the invention.

FIG. 1 shows a single logic chip 10 according to the invention, which comprises a memory 11 and a computing unit 12. Memory 11 may include a non-volatile, computer-readable storage medium 90 according to the fourth aspect of the invention, which may comprise, in particular, a computer program product 80 according to the third aspect. A switching device 20 according to the invention is also illustrated, which may, in particular, additionally or alternatively include a non-volatile, computer-readable storage medium 90 according to the fourth aspect of the invention, which may comprise, in particular, a computer program product 80 according to the third aspect. Switching device 20 may furthermore be able to be arranged in a housing 21, housing 21 preferably fully surrounding switching device 20 to protect it against an application of force.

Figure 2:
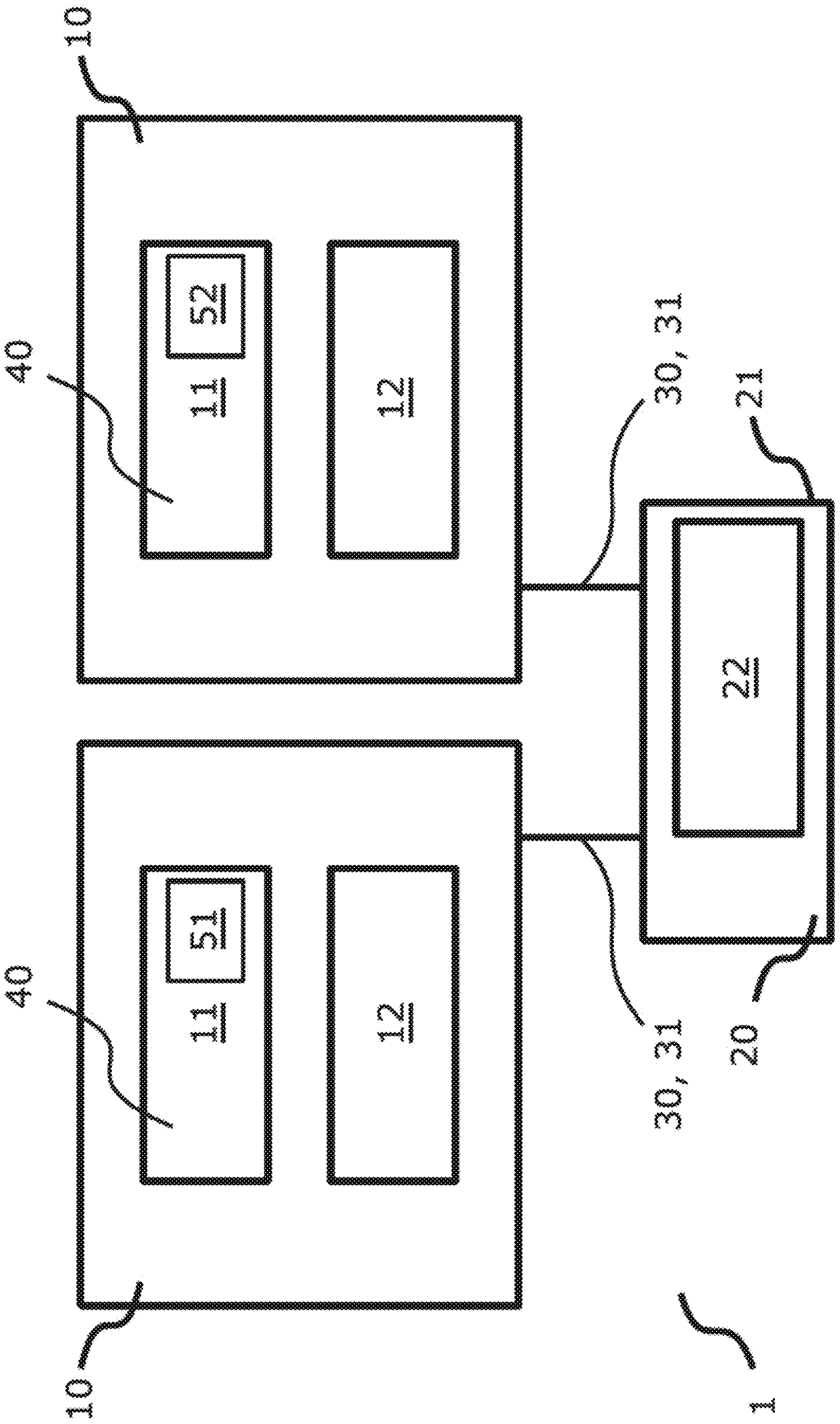
FIG. 2 schematically shows a circuit system, including a switching device.

FIG. 2 shows a circuit system 1 according to the invention, which comprises (at least) two single logic chips 10, which, in turn, each include a memory 11 and a computing unit 12. A data processing 40 may take place in each case in memory 11 and/or in computing unit 12. In particular, a first data part 51 may take place in a single logic chip 10 (the left one in this case). In particular, a second data part 52 may take place in a single logic chip 10 (the right one in this case). It may be provided that first data part 51 and second data part 52 together essentially correspond to the (received and recorded) measurement data or data 50. Single logic chips 10 may be connected via a switching device 20. A data transmission 30 may be facilitated, in particular, via switching device 20 for the purpose of data exchange 31. Switching device 20 may include a housing 21. A printed circuit board 22 may be provided within housing 21, which facilitates, for example, the electrical interconnection of single logic chips 10.

Figure 3:
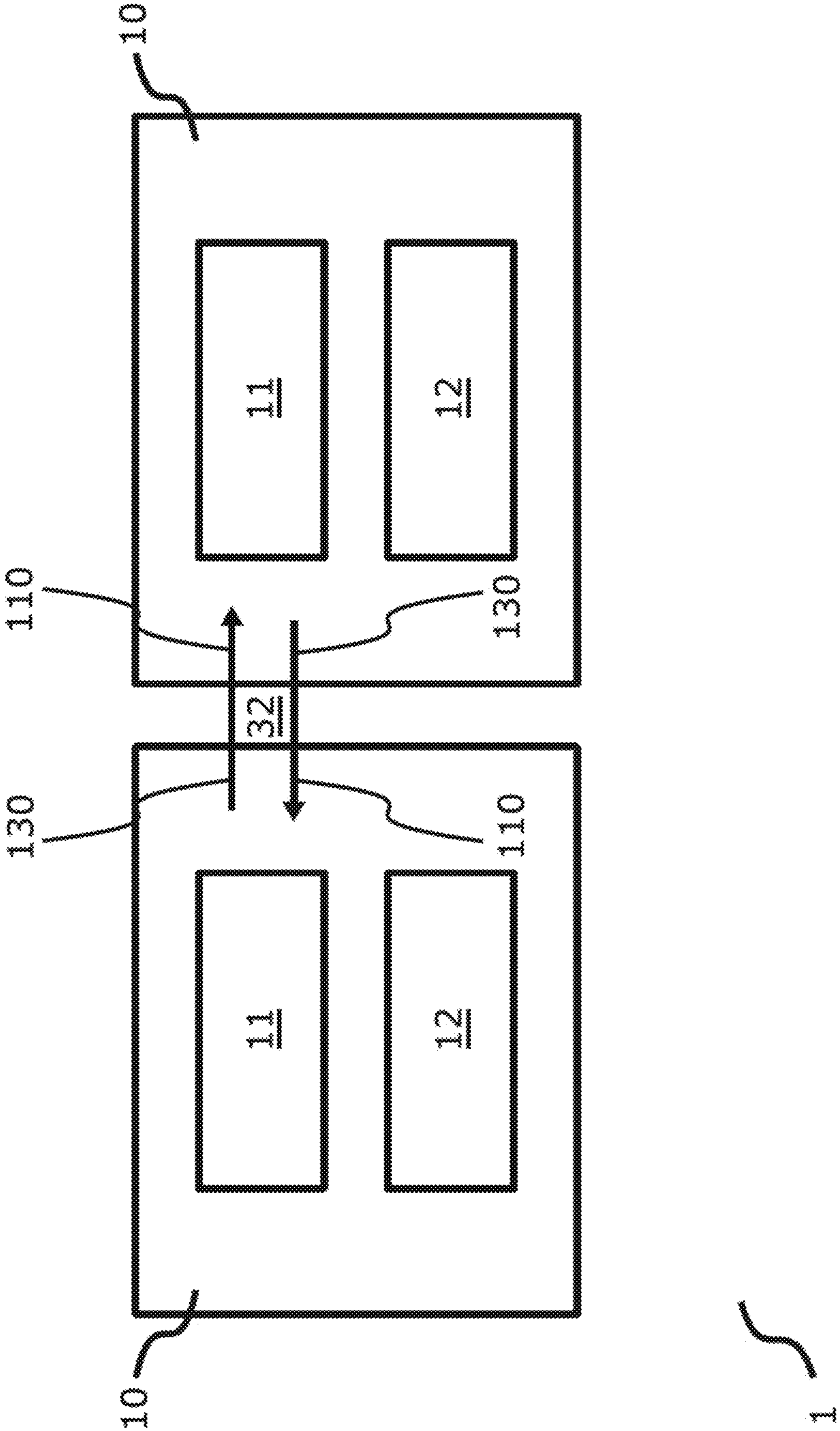
FIG. 3 schematically shows a circuit system, including a daisy chain connection.

FIG. 3 shows a circuit system 1 according to the invention, which comprises (at least) two single logic chips 10, which, in turn, each include a memory 11 and a computing unit 12. A daisy chain connection 32 may be provided in each case between particular memories 11 and/or computing units 12. Single logic chips 10 may be connected directly thereby, by means of which a connection via a switching device 20 is advantageously not necessary. Complexity and costs may be saved thereby. It is alternatively conceivable to additionally provide a switching device 20 to advantageously achieve an even better distribution and/or optimization of the storage and/or computing steps. A data transmission 30 or a data exchange 31 may take place via daisy chain connection 32. it may be provided that a reception of data 50 takes place in each case by means of a single logic chip 10 and a storage in memory 11 of data 50 or a data part or a first data part 51 and/or a second data part 52.

Figure 4:
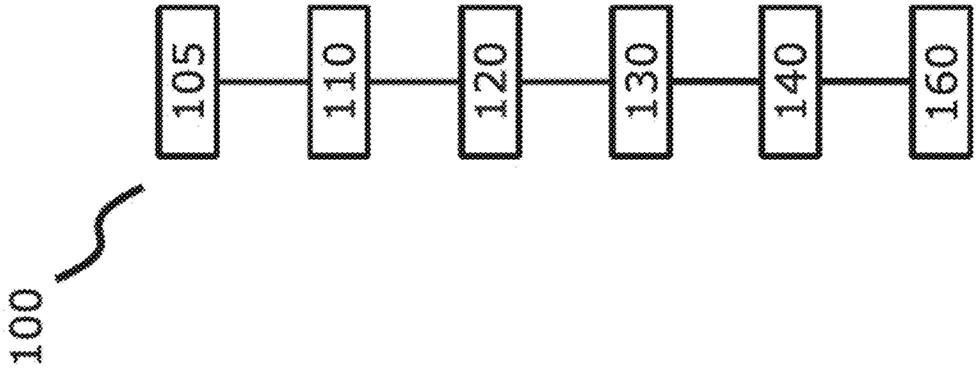
FIG. 4 schematically shows a method according to the invention.

FIG. 4 shows a method 100 according to the invention, for example for the purpose of data processing 40, which includes a circuit system 1 according to the first aspect of the invention, comprising at least the following steps for each of the at least two single logic chips 10:

- Transmitting 105 data 50 with the aid of switching device 20;
- Receiving 110 data 50 for the purpose of data processing 40 with the aid of single logic chip 10;
- Storing 120 a first data part 51 in memory 11 of single logic chip 10;
- Transmitting 130 at least one second data part 52 to memory 11 of at least one other single logic chip 10, first data part 51 and the at least second data part 52 preferably overlapping redundantly only in the peripheral regions;
- Calculating 140 a multiplicity of computation operations 141, based on data 50;
- Obtaining an overall result 160.

Figure 5:
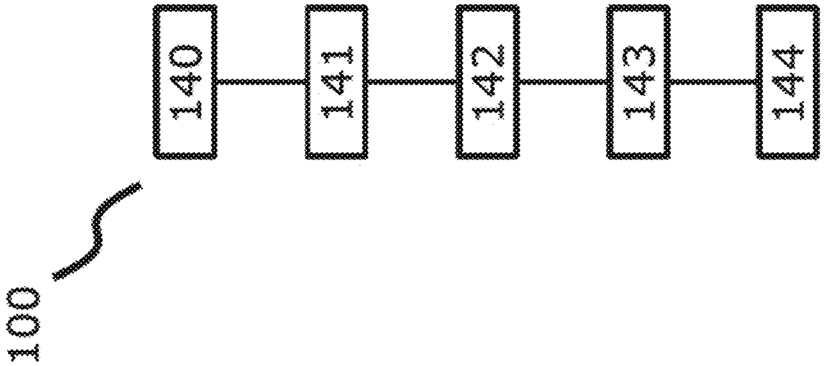
FIG. 5 schematically shows a method according to the invention, in particular, an individual calculation.

FIG. 5 shows a method 100, in particular, the step of calculating 140 a multiplicity of computation operations 141 being illustrated in greater detail. The multiplicity of computation operations 141 may be divided into parts of computation operations 142, preferably into essentially uniform parts, which are then carried out by a first single logic chip 10 in an individual calculation 143, for example based on (only) a first data part 51. An individual result 144 may be ascertained thereby (in each case), preferably by computing unit 12 of one or each single logic chip 10.

Figure 6:
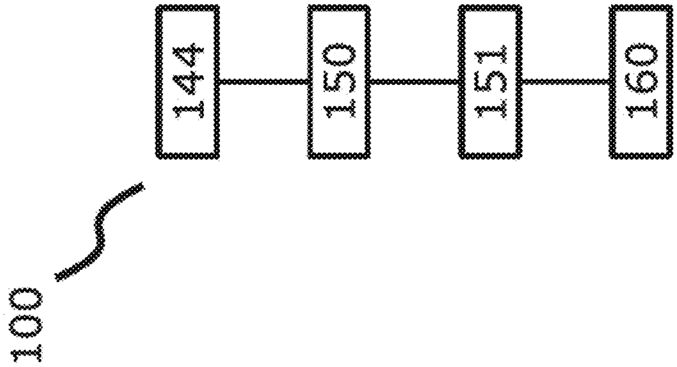
FIG. 6 schematically shows a method according to the present invention in particular, a post-processing.

FIG. 6 shows a method 100, a post-processing step 150 being carried out, based on an individual result 144 or individual results 144 of single logic chips 10. This step is preferably carried out separately by particular computing unit 12 of single logic chips 10 to advantageously facilitate a fast and/or distributed calculation 140. A post-processing result 151 may be ascertained in each case. It may subsequently be combined into an overall result 160. It is also conceivable to not carry out any post-processing steps 150 and thus obtain an overall result 160 directly. Overall result 160 may be combined, for example, by switching device 20, preferably in that individual results 144 of all single logic chips 10 are combined.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit system for a radar, lidar, or camera system, the circuit system comprising:

at least two single logic chips, each comprising a memory and a computing unit; and a switch connecting the at least two single logic chips to each other, the switch facilitating a data processing by the at least two individual logic chips by a combination of the particular memories and computing units.

2. The circuit system according to claim 1, wherein the switch includes a housing and is arranged on a printed circuit board arranged in the housing, wherein the at least two single logic chips are interconnected by the switch to allow the data processing to take place only thereby and/or only by combining the particular memories and/or computing units, and wherein, each of the at least two single logic chips are designed such that their memories and/or computing units alone do not facilitate a data processing.

3. The circuit system according to claim 1, wherein each of the at least two single logic chips has a data transmission via the switch, the data transmission comprising a data exchange with a memory and/or a computing unit of at least one other single logic chip or the data exchange comprising the exchange of at least one memory address, a read command, and/or a write command.

4. The circuit system according to claim 1, wherein the switch includes a PCIe interface and/or an InfiniBand bus device, to which the at least two single logic chips are connected for the purpose of data transmission.

5. The circuit system according to claim 1, wherein the switch has a daisy chain connection, the at least two single logic chips being connected to each other directly to facilitate a switch-free data exchange.

6. The circuit system according to claim 1, wherein the data transmission has an Ethernet connection, in particular, each of the at least two single logic chips being connectable to a second switch for the purpose of data transmission, the switch including the switch, and/or the second switch being arranged on a switch circuit board which is separate from the printed circuit board of the switch, the switch circuit board being able to be arranged outside the housing of the switch.

7. The circuit system according to claim 1, wherein a protocol comprising remote direct memory access is used for the data exchange via the data transmission to relieve the load on the memory and/or the computing unit of at least one of the at least two single logic chips.

8. The circuit system according to claim 1, wherein the at least two single logic chips have an LO reference clock sharing and/or a digital synchronization, which may take place between the at least two single logic chips via the switch, using the data transmission and/or using a separate synchronization circuit.

9. The circuit system according to claim 1, wherein the data processing includes at least the calculation based on data recorded by a radar, lidar, or camera system, the calculation including a multiplicity of computation operations, which may not be carried out by one single logic chip alone and/or not in real time, the multiplicity of computation operations being able to be divided into, essentially uniform, parts of computation operations, the parts of computation operations being able to be distributed uniformly between the at least two single logic chips for the purpose of individual calculation, and wherein the calculation is adapted to be carried out and/or carried out in real time.

10. The circuit system according to claim 9, wherein the calculation comprises a Fourier transform or a fast Fourier transform, and wherein the individual calculation includes the calculation of subareas of the Fourier transform.

11. The circuit system according to claim 9, wherein each of the at least two single logic chips is also configured to carry out at least one post-processing step after the individual calculation, based on an individual result of the individual calculation of this single logic chip, for the purpose of obtaining a post-processing result.

12. A method for the purpose of data processing, which includes the circuit system according claim 1, the method comprising:

receiving data for data processing with the aid of the single logic chip;

storing a first data part in the memory of the single logic chip;

transmitting at least one second data part to the memory of at least one other single logic chip, the first data part and the at least second data part overlapping redundantly only in peripheral regions; and carrying out an individual calculation of a first part of computation operations based on the first data part, with the aid of the computing unit of the single logic chip for the purpose of obtaining an individual result.

13. The method according to claim 12, wherein at least the following step is carried out before receiving data for the purpose of data processing by the single logic chip:

transmitting data to the single logic chip with the aid of the switch, or wherein at least one of the following steps are carried out after the individual calculation of a first part of computation operations by the computing unit of the single logic chip, based on the first data part:

carrying out a post-processing step by the single logic chip, based on the individual result for obtaining a post-processing result; and/or combining the individual results or post-processing results with the aid of the switch and/or the computing unit for the purpose of obtaining an overall result.

14. A computer program product comprising instructions which may be executed by a computing unit of a single logic chip, which, upon the execution of the computer program product by the computing unit prompt the computing unit to implement the method according to claim 12.

15. A non-volatile, computer-readable storage medium, which comprises a computer program product according to claim 14.

* * * * *